(12) United States Patent
Smith

(10) Patent No.: US 6,441,405 B1
(45) Date of Patent: Aug. 27, 2002

(54) MICRO-MECHANICAL ELEMENTS

(75) Inventor: Charles G. Smith, Cambridge (GB)

(73) Assignee: Cavendish Kinetics Limited (GB)

( * ) Notice: Subject to any disclaimer, the term of this patent is extended or adjusted under 35 U.S.C. 154(b) by 0 days.

(21) Appl. No.: 09/701,898

(22) PCT Filed: Jun. 1, 1999

(86) PCT No.: PCT/GB99/01740

§ 371 (c)(1),
(2), (4) Date: Dec. 4, 2000

(87) PCT Pub. No.: WO99/63559

PCT Pub. Date: Dec. 9, 1999

(30) Foreign Application Priority Data

Jun. 4, 1998 (EP) .............................. 98304445

(51) Int. Cl.[7] .............................................. H01L 33/00
(52) U.S. Cl. .......................................... 257/103; 257/99
(58) Field of Search .......................... 257/103, 79, 99; 307/400

(56) References Cited

U.S. PATENT DOCUMENTS 4,205,242 A * 5/1980 Micheron et al. ........... 307/400

FOREIGN PATENT DOCUMENTS

| EP | 0709911 | 5/1996 |
| EP | 0794543 | 9/1997 |
| WO | WO 9303385 | 2/1993 |

OTHER PUBLICATIONS

"Nonvolatile Micromechanical Memory Cell", IBM Technical Disclosure Bulletin, vol. 36, No. 7, Jul. 1, 1993, p. 45–46, XP000383596.*

* cited by examiner

Primary Examiner—David Nelms
Assistant Examiner—Thao P Le
(74) Attorney, Agent, or Firm—Cantor Colburn LLP

(57) ABSTRACT

A micro-mechanical element includes a discrete switching element and a switching means for applying force to the switching element to move the switching element between two stable positions.

17 Claims, 11 Drawing Sheets

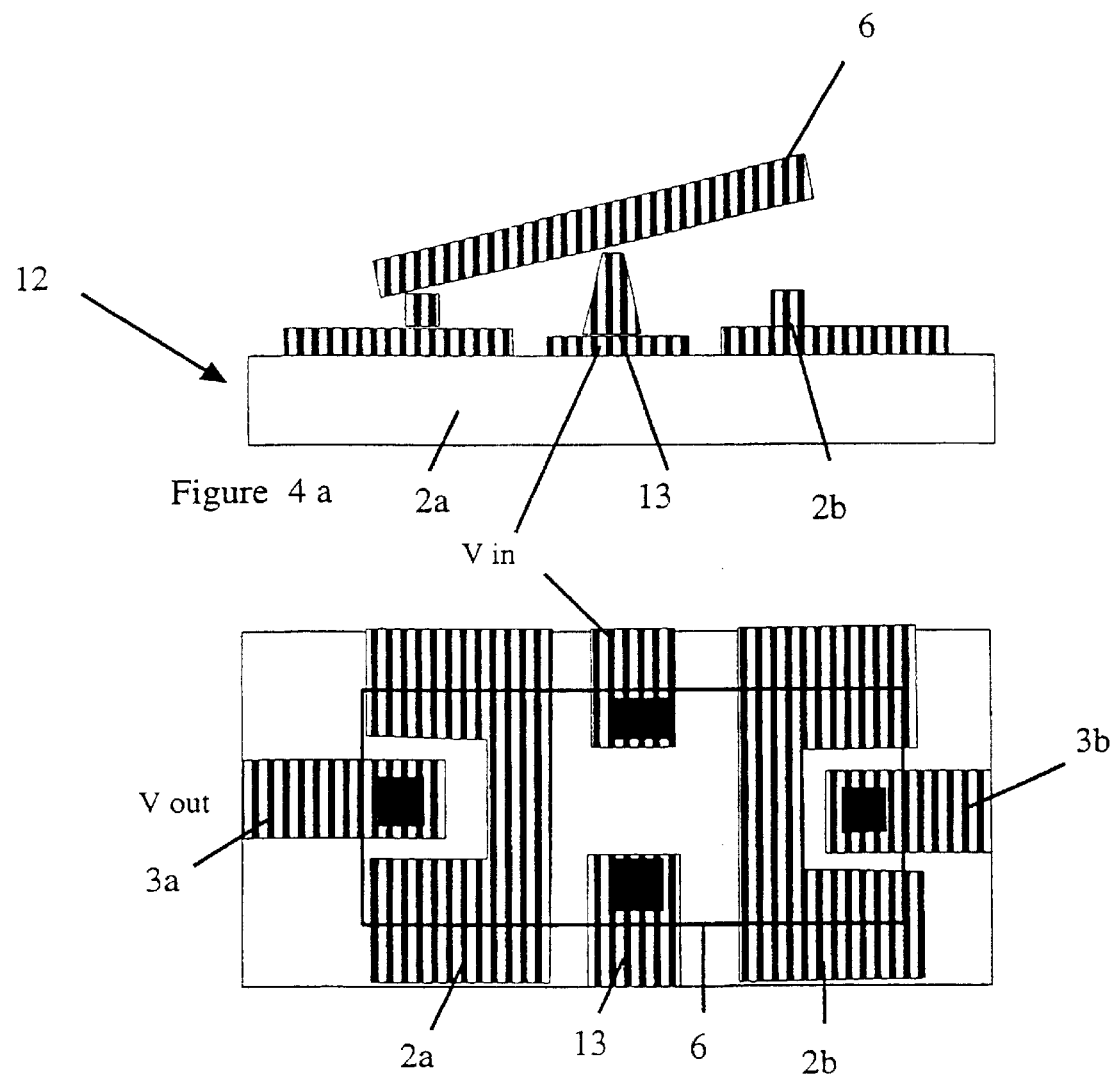

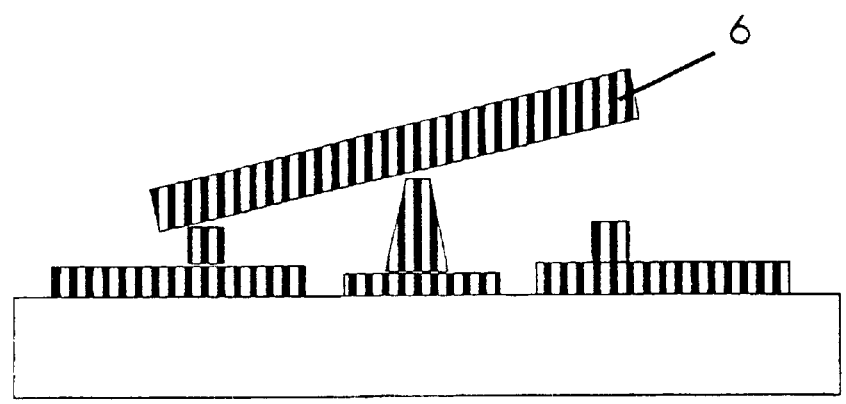
Figure 5 a
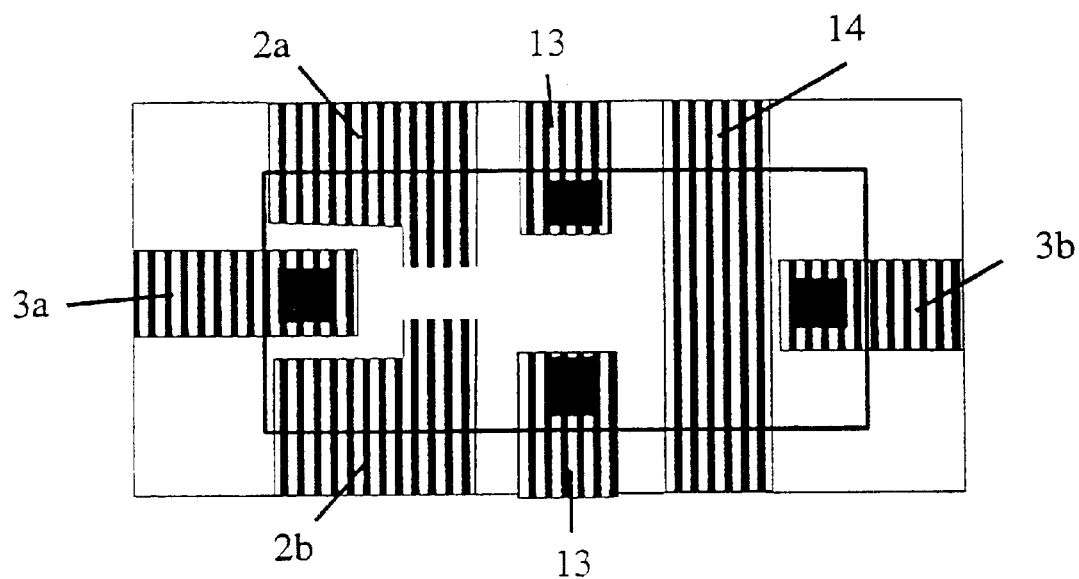
Figure 5 b
AND Truth table
| 2a | 2b | 3b |
|---|---|---|
| 1 | 1 | 1 |
| 0 | 1 | 0 |
| 1 | 0 | 0 |
| 0 | 0 | 0 |
Figure 5 c

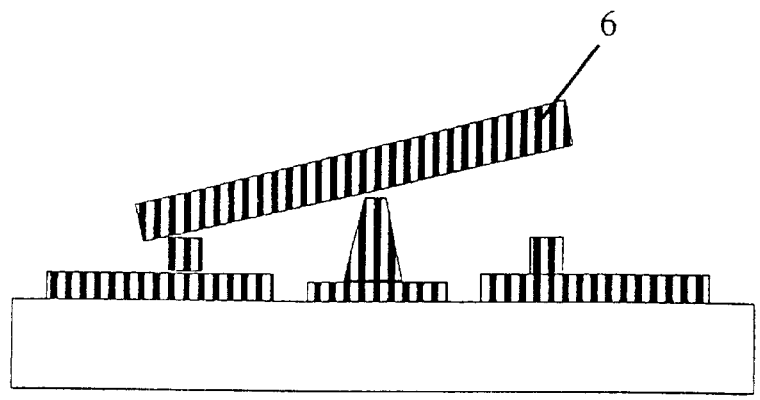
Figure 6 a
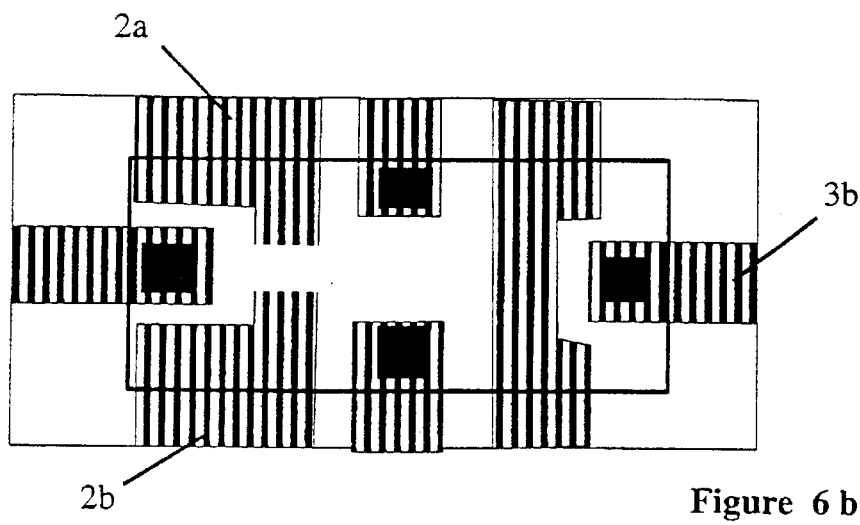
Figure 6 b
OR Truth table
| 2a | 2b | 3b |
|----|----|----|
| 1  | 1  | 1  |
| 0  | 1  | 1  |
| 1  | 0  | 1  |
| 0  | 0  | 0  |
Figure 6 c

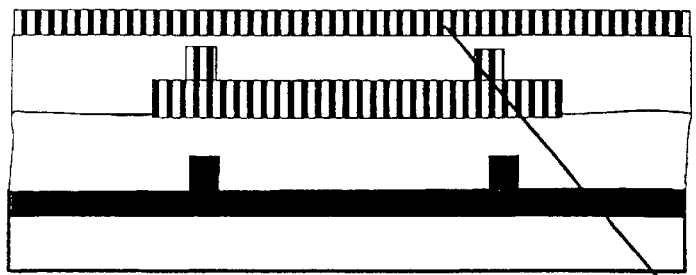
Figure 8 a
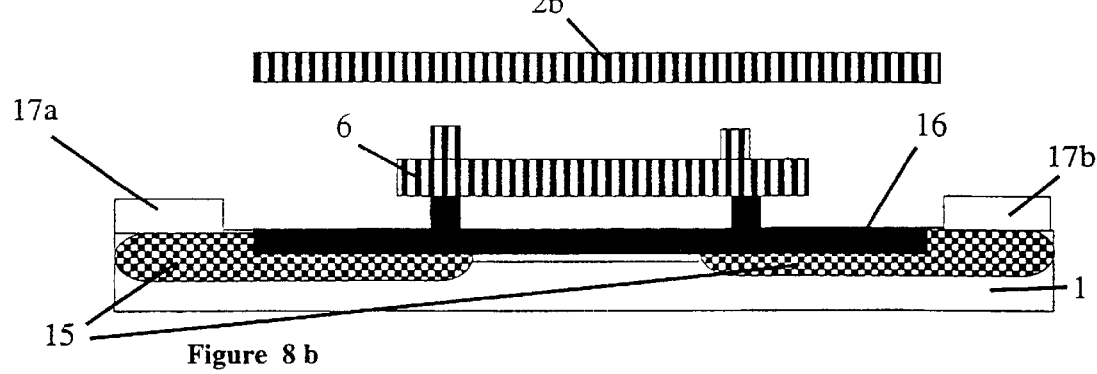
Figure 8 b
Figure 8 c

MICRO-MECHANICAL ELEMENTS

TECHNICAL FIELD

This invention relates to micro-mechanical elements and, more particularly, to an improved design and method of manufacture of such micro-mechanical elements.

BACKGROUND OF THE INVENTION

There is a growing interest in the fabrication of micro-mechanical elements using fabrication processes developed for semi-conductor electronic components. As fabrication processes have improved, micro-mechanical devices have become smaller which has provided them with the ability to switch more quickly. This has lead to micro-mechanical elements being employed as micro switches, accelerometers, optical elements and capacitance switches amongst other things. If, however, micro-mechanical elements are to be employed as logic elements or memory elements which are able to compete with semi-conductor processors and memory chips their size must be shrunk to around a micron squared in area. There are a number of problems in shrinking micro-mechanical elements to this size. For example, many conventional micro-mechanical elements have a cantilever arm which must be sufficiently rigid to maintain its shape and make contact with electrodes only in the desired positions. Furthermore, in many examples the cantilever arm must have sufficient resiliency to return to a rest position when not influenced by electrostatic or electromagnetic fields. These considerations limit the minimum thickness a conventional cantilever arm can be made. They also limit the speed of switching as electrostatic energy has to be used to overcome the mechanical rigidity of the cantilever.

Conventional micro-mechanical elements have thus had thick cantilever arms which require large electrostatic switching electrodes, which has, in turn, limited the minimum size and maximum switching speed of micro-mechanical elements.

SUMMARY OF THE INVENTION

The object of the present invention is to provide a micro-mechanical element having a smaller size and faster switching than conventional elements.

According to the present invention there is provided a micro-mechanical element comprising:
  a discrete switching element; and
  switching means for applying force to the switching element to move the switching element between two stable positions.

The switching means may apply either electrostatic or electromagnetic force.

The switching element may be suspended in fluid which regulates its movement.

The micro-mechanical element may have one or more protrusions for abutting corresponding indentations on the switching element. The number of protrusions is preferably three.

The micro-mechanical element may be used to implement a memory element. Where a non-volatile memory element is required, adhesion ensures that the switching element remains in the stable positions.

A coating may be applied to surfaces of the micro-mechanical element or switching element to control adhesion between these elements. The coating may preferably be a polymer or oil.

The micro-mechanical element may be used to implement an optical switch. The switching element may then be fabricated from a semi-transparent material and one stable position may facilitate constructive interference between reflected and transmitted components of light, and the second stable position may facilitate destructive interference between the reflected and transmitted components of light. Alternatively, the position of the switching element may be used to modulate transmission of light through a transparent micro-mechanical element. The optical switch may be used as a pixel in a display.

Another implementation of an optical switch according to the invention has either a reflective switching element and an absorbent surface or a reflective surface and an absorbent switching element. Then, in one of the stable positions the light is incident on the switching element and in the other stable position light is incident on the surface, and light is thus either absorbed or reflected.

The micro-mechanical element may further comprise a pivot, and the switching means may then operate to tilt the switching element between two stable positions. A different circuit may be completed at each of the stable positions and the switching means may operate to tilt the switching element in accordance with the requirements of a logic gate.

Alternatively, the micro-mechanical element may further comprise a semi-conductor base with doped regions arranged such that the switching element causes currents to flow between the doped regions when the switching element is in one of the stable positions. Another alternative is to use a capacitance circuit to respond to the position of the switching element.

The abovementioned devices have the advantage that they may be used in integrated circuits in place of conventional semi-conductor devices, providing small, fast-switching and temperature resistant circuit elements.

Also according to the present invention there is provided a method of manufacturing a micro-mechanical element, the method comprising the steps of:
  providing a metal electrode on a substrate;
  providing a temporary layer over the electrode;
  forming a switching element on the temporary layer; and
  removing the temporary layer such that the element is discrete and movable by forces applied by the electrode.

Preferably the electrode, temporary layer or element are provided by photolithographic, chemical deposition, sputtering or metal vaporisation techniques.

The method may further comprise the steps of:
  providing a protective layer on the temporary layer;
  etching the temporary layer where it is not covered by the protective layer to form a space;
  forming the switching element by electroplating in the space etched in the temporary layer; and
  etching into the substrate to free the electroplated switching element.

Alternatively, the method may further comprise the steps of:
  providing a further temporary layer over the switching element;
  forming a second metal electrode on the further temporary layer; and
  removing the second temporary layer such that the element is discrete and movable by forces applied by the second electrode.

The above methods are advantageous in that they allow fabrication of elements according to the invention using known manufacturing techniques such as photolithography, chemical deposition, sputtering or metal vaporisation.

BRIEF DESCRIPTION OF THE DRAWINGS

Examples of the invention will now be described with reference to the accompanying drawings, in which:

FIG. 4a is an illustration of an alternative micro-mechanical element;

FIG. 4b is a plan view of the micro-mechanical element of FIG. 4a;

FIG. 5a is an illustration of a switching element implementing an AND Logic Gate;

FIG. 5b is a plan view of the micro-mechanical element of FIG. 5a;

FIG. 5c is a truth table for the micro-mechanical element of FIGS. 5a and 5b;

FIG. 6a is an illustration of a micro-mechanical element implementing an OR Logic Gate;

FIG. 6b is a plan view of the micro-mechanical element of FIG. 6a;

FIG. 6c is a truth table for the micro-mechanical element of FIGS. 6a and 6b;

FIG. 7a is an illustration of a micro-mechanical element implementing a NOT Logic Gate;

FIG. 7b is a plan view of the micro-mechanical element of FIG. 7a;

FIG. 7c is a truth table for the micro-mechanical element of FIGS. 7a and 7b;

FIG. 8a is an illustration of a micro-mechanical element implementing a semi-conductor switch during fabrication;

FIG. 8b is an illustration of the micro-mechanical element of FIG. 8a in a first position;

FIG. 8c is an illustration of the micro-mechanical switch of FIGS. 8a and 8b in a second position;

FIG. 11e is a plan view of the micro-mechanical element of FIG. 11a.

DETAILED DESCRIPTION OF THE PREFERRED EMBODIMENT

Figure 1:
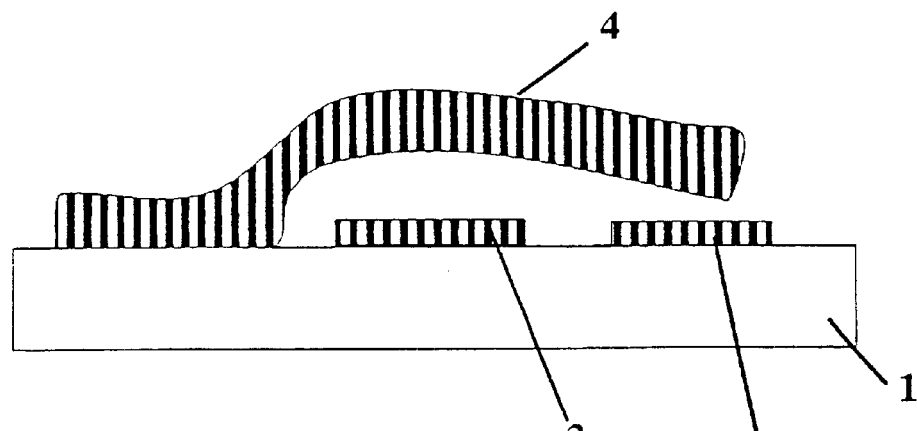
FIG. 1a is an illustration of a micro-mechanical element of the prior art in a non-contact state.
FIG. 1b is an illustration of a micro-mechanical element of the prior art in a contact state.
Figure 1:
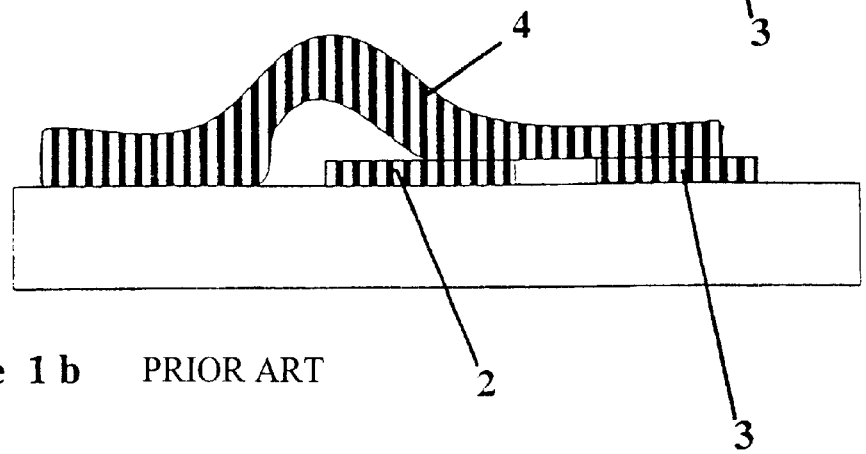

Referring to FIGS. 1a and 1b, a conventional micro-mechanical element typically comprises a substrate 1 having a switching electrode 2 and contact electrode 3 disposed on its surface. A cantilever arm 4 is also provided which acts under the influence of switching electrode 2 to contact the contact electrode 3. When the switching electrode 2 is turned off the natural resiliency of the cantilever arm 4 should break the contact between the cantilever arm 4 and contact electrode 3.

As can be seen from FIG. 1b, thin cantilever arms 4 may lack the requisite rigidity to resist the electrostatic retraction of switching electrodes 2 and sag into contact with the switching electrode 2. This destroys the usefulness of the micro-mechanical element. Similarly, thin cantilever arms 4 may not be sufficiently resilient to overcome adhesion forces between the surfaces of the arm 4 and electrodes 2 and 3 in contact. As smaller micro-mechanical elements inevitably have smaller and thinner cantilever arms, the above problems have led to a minimum limit on the size of conventional micro-mechanical elements.

Figure 2:
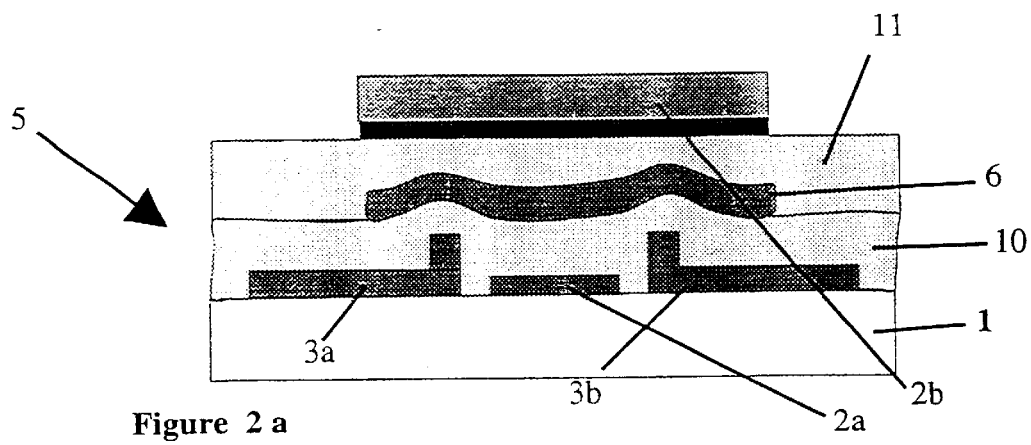
FIG. 2a is an illustration of a micro-mechanical element according to the present invention during fabrication.
FIG. 2b is an illustration of the micro-mechanical element of FIG. 2a in a contact state.
FIG. 2c is an illustration of the micro-mechanical element of FIGS. 2a and 2b in a non-contact state.
Figure 2:
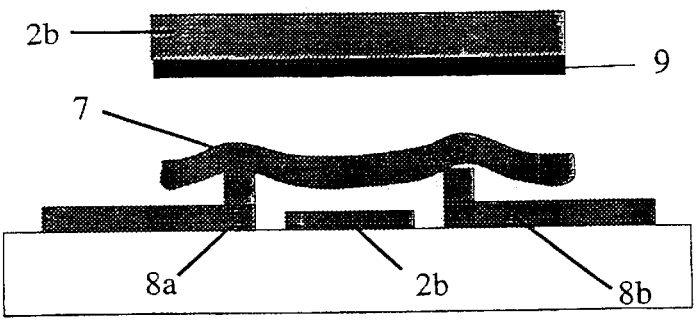
Figure 2:
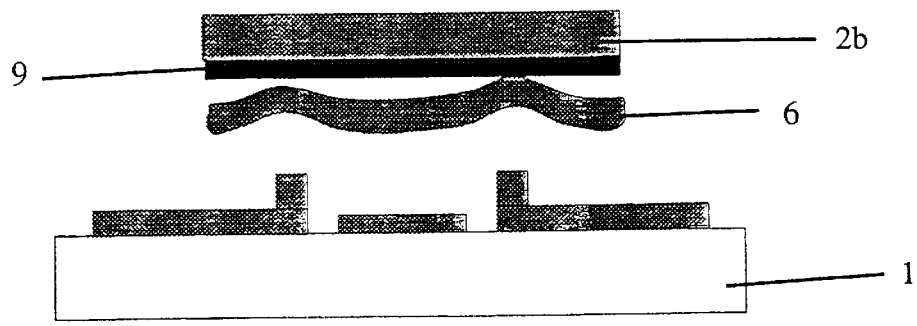

Referring to FIGS. 2a, 2b and 2c a micro-mechanical element 5 according to the invention and having a substrate 1, switching electrodes 2a and 2b, contact electrodes 3a, 3b and switching element 6 overcomes the abovementioned problems.

An attractive electrostatic force may be applied to the switching element 6 via switching electrode 2a. This causes the discrete switching element 6 to be drawn towards contact electrodes 3a, 3b and complete the circuit between these contact electrodes 3a, 3b, as shown in FIG. 2b. It can be appreciated that as the switching element generally moves free of mechanical constraints the required inherent resiliency may be reduced and hence smaller, thinner switching elements 6 may be used.

The switching element 6 is provided with three indentations 7 for abutting protrusions 8a, 8b of respective contact electrodes 3a, 3b. The protrusions 8a, 8b and indentations 7 stabilise the position of the switching element 6 and the protrusions 8a, 8b also help to reduce the contact area between the switching element 6 and contact electrodes 3a, 3b and so reduce adhesion between them. Thus, the electrostatic force required to break the contact between the switching element 6 and contact electrodes 3a, 3b is reduced and the element 5 can be smaller. Similarly, as the fabrication of indentations 7 on the switching element 6 leads to bumps on the upper surface of switching element 6, the contact surface area between switching element 6 and switching electrode 2b (or insulating layer 9) is also reduced, providing a corresponding advantage.

It can be appreciated that the provision of 3 protrusion/indentation pairs also allows each protrusion/indentation pair to be in contact regardless of minor variations in height of protrusions 8a, 8b or depth of indentations 7 which may be caused by inaccuracies in fabrication.

It can be appreciated that the protrusions 8a, 8b and indentations 7 are not necessary and an alternative way of limiting the contact area is simply to control the roughness of the element 6 and contact electrodes 3a, 3b by the fabrication process used.

The micro-mechanical element 5 may be used as a non-volatile memory element. The switching element 6 has two stable positions, one when it is in contact with the switching electrode 2b (or insulating layer 9), and the other when it is in contact with the contact electrodes 8a, 8b. Due to the adhesion force experienced by the switching element 6 in the stable positions, the switching element 6 will stay in either of the stable positions even when the micro-mechanical element is turned off. Thus, the circuit between the contact electrodes 3a, 3b remains open or closed.

In an alternative embodiment the switching element 6 has an aperture and the micro-mechanical element 1 has a post around which the aperture may slide. This arrangement allows free movement of the switching element 6 between switching electrodes 2a, 2b but retains the switching element in its lateral position. The switching element 6 can also be maintained in a correct lateral position by including a surrounding electrode (not shown) in the micro-mechanical element 5. The surrounding electrode laterally surrounds the switching element 6 and is maintained at a similar charge to the element 6, thus causing the element 6 to be repelled to an equilibrium position inward of the surrounding electrode. As fabrication techniques improve such restraining mechanisms will not be required.

In order to break the circuit formed when the switching element 6 is in contact with the protrusions 8a, 8b and thus contact electrodes 3a, 3b, an attractive electrostatic force is applied to the switching element 6 via switching electrode 2b. The switching element 6 then moves away from the contact electrodes 3a, 3b to abut an insulating layer 9 provided on the switching electrode 2b, as shown in FIG. 2c. It can be appreciated that the insulating layer 9 need not be provided and the switching element 6 may then receive a charge from the switching electrode 2b when the two are in contact.

It should be noted that a smaller version of this device can be made by removing electrode 2a and implementing switching by applying an opposite voltage to that on electrode 2b to electrodes 3a and 3b.

At the rest positions illustrated in FIG. 2b and FIG. 2c and described above, adhesion forces keep the switching element 6 in place even when no voltage is applied to the switching electrodes 2a, 2b. The electrostatic force applied to the switching element 6 by switching electrodes 2a, 2b overcomes this adhesion force to actuate switching.

In some applications, application of a very thin layer of liquid such as oil, or a polymer can be employed to provide a surface tension effect that enhances the adhesion of switching element 6 to the protrusions 8a, 8b, the insulating layer 9, or any other necessary surface.

The liquid can also be used to limit the movement of the element 6. The adhesion forces between the switching element 6 and the protrusions 8a, 8b need to be overcome to break the circuit between the contact electrodes 3a, 3b. The switching element 6 then moves up to the switching electrode 2b. However, a liquid may be used having surface tension sufficient to keep element 6 close to the protrusions 8a, 8b but not in electrical contact and the element 6 can then be switched on more quickly than if it has moved all the way up to the switching electrode 2b. In effect, the liquid adds another minimum in the potential energy versus distance from the protrusions 8a and 8b for element 6. The main minimum is when the metal element makes contact with the metal contacts 8a and 8b and the new minimum is created by the surface tension of the liquid bridging the gap between the element 6 and the protrusions 8a, 8b. Furthermore, by using liquids containing large molecules or colloidal particles several minima can be created very close to the contact point every time the element 6 moves one particular diameter away. Generally, creating a second stable position very close to the contact point allows the element 6 to be switched more quickly and with less energy.

Figure 3A:
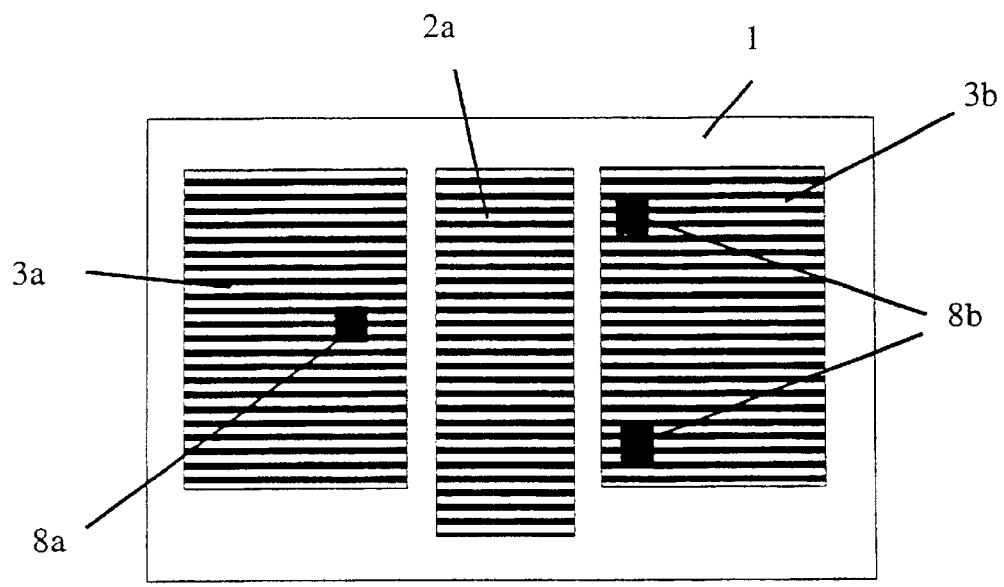
FIG. 3a is a plan view of the micro-mechanical element of FIGS. 2a, 2b and 2c.
Figure 3B:
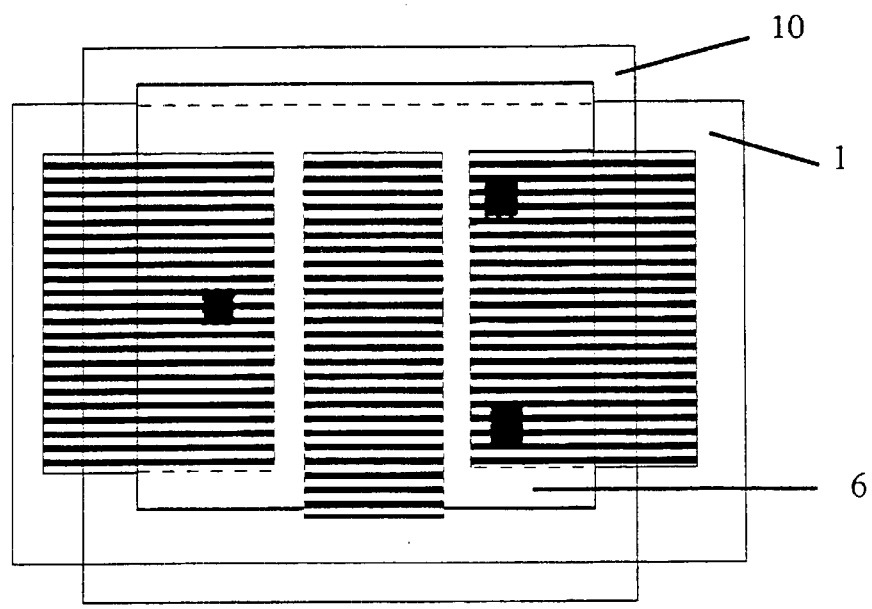
FIG. 3b is a second plan view of the micro-mechanical element of FIGS. 2a, 2b, 2c and 3a showing a switching element.

Referring to FIGS. 2a, 3a and 3b, the micro-mechanical element 5 may be fabricated by photolithographic, chemical deposition, sputtering or metal vaporisation techniques in several stages. First the contact electrodes 3a, 3b and switching electrode 2a, along with protrusions 8a, 8b are provided on substrate 1 as shown in FIG. 3a. Then a temporary layer 10 is formed over these electrodes 3a, 3b, 2a and protrusions 8a, 8b on which is formed the switching element 6 as shown in FIG. 3b. A further temporary layer 11 is then provided on which an insulating layer 9 and a switching electrode 2b are formed in turn.

Referring to FIGS. 4a and 4b, a micro-mechanical element 12 may alternatively include a pivot, in this example two pivots 13. Then, by applying voltages to the switching electrodes 2a, 2b, the switching element 6 tilts either to the left or right to contact either contact electrode 3a or contact electrode 3b. A circuit is therefore completed either between contact electrode 3a and central pivot 13 or contact electrode 3b and central pivot 13.

It can be appreciated that the different arrangements of switching electrodes 2a, 2b and contact electrodes 3a, 3b can be exploited to implement various logic gates.

Referring to FIGS. 5a, 5b and 5c, an AND logic gate is implemented by having two switching electrodes 2a, 2b on one side of the central pivots 13 and having a ground electrode 14 on the opposite side. The pivots 13 form an electrode held at the same positive voltage as that provided to switching electrodes 2a, 2b. Thus, when the same positive voltage applied to pivot 13 is applied to only one of the switching electrodes 2a, 2b there is not sufficient force to tilt the switching element 6 to contact the contact electrode 3b. This only occurs when the voltage applied to the central pivot 13 is applied to both switching electrodes 2a, 2b. In this arrangement it is necessary for the areas of overlap and distance from the pivots 13 of contact 14, switching element 6 and switching electrodes 2a and 2b to be such that the attraction between the element 6 and the ground electrode 14 is less than that between the element 6 and one of the switching electrodes 2a and 2b. When both electrodes 2a and 2b have the voltage applied to them as the element 6 then the element 6 is attracted to contact electrode 3b by ground electrode 14. The 1 in the Truth Table of FIG. 5c is a well defined positive voltage, and 0 is zero volts.

Referring to FIGS. 6a, 6b and 6c, an OR Logic Gate is implemented with the same electrode arrangement as an AND Logic Gate, except that the areas of overlap between switching electrodes 2a, 2b and switching element 6 have been adjusted so that the attraction between the ground electrode 14 and switching element 6 is enough to overcome the attractive force between element 6 and either of the switching electrodes 2a, 2b when only one has the voltage applied to it. If neither of the switching electrodes 2a, 2b have the voltage applied to them, the attraction between element 6 and ground electrode 14 is not overcome and the circuit between pivots 13 and the contact electrode 3b is not completed.

Figure 7:
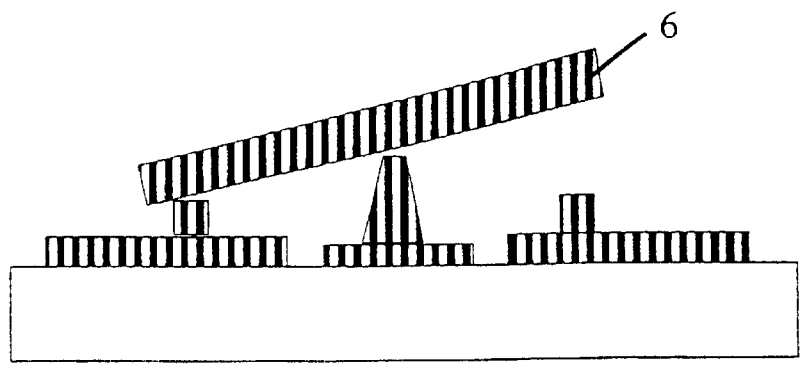
Figure 7:
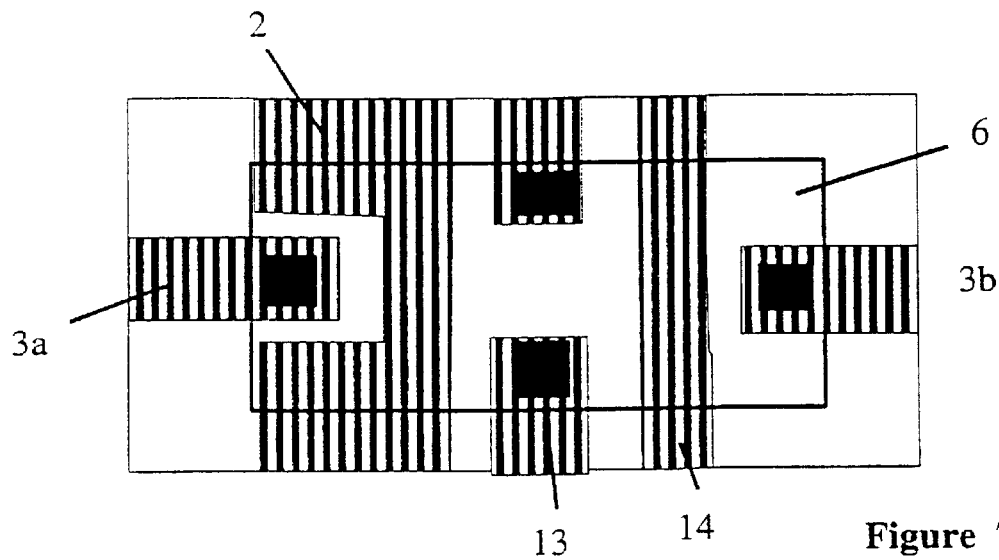
Figure 7:
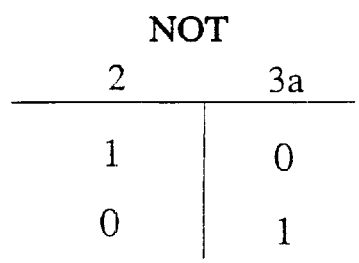

Referring to FIGS. 7a, 7b and 7c, a NOT Logic Gate is implemented by an arrangement in which the output is between pivots 13 and contact electrode 3a. When the switching electrode 2 is positive there is very little force between it and the positively charged switching electrode 6 so the cantilever is attracted by ground electrode 14 to contact 3b, but when the switching electrode 2 is held at ground, the voltage difference between it and the positive voltage on element 6 leads to a torque that is greater than that due to electrode 14.

Referring to FIGS. 8a to 8c, in another example, a memory element is implemented by the position of the switching element being detected using a capacitance sensing circuit or, where the switching element 6 is charged, a semi-conductor being located close to one of the rest positions of the switching element 6.

In this example, the substrate 1 comprises a semiconductor having two doped regions 15 adjacent an insulating layer 16 upon which a switching element 6 may rest. Two contacts 17a and 17b are adjacent to the doped regions 15.

When the switching element 6 is in contact with switching electrode 2b it becomes charged. If the element 6 is positively charged and the doping of the semiconductor is N type, "electrons" are drawn into the undoped region of the semiconductor 1 and resistance will be reduced between electrodes 17a and 17b, and this change in resistance is detected. The resistance is reduced more when the charged switching element 6 is close to the semiconductor. The element 6 is switched between the two positions by applying electric fields between the semiconductor and the switching electrode 2b. This can be used as a non-volatile memory element where element 6 has two stable positions, and when adhesion forces stick it to either the switching electrode 2b or the insulating layer 16.

An alternative device has a thin doped layer under the switching element 6.

Figure 9:
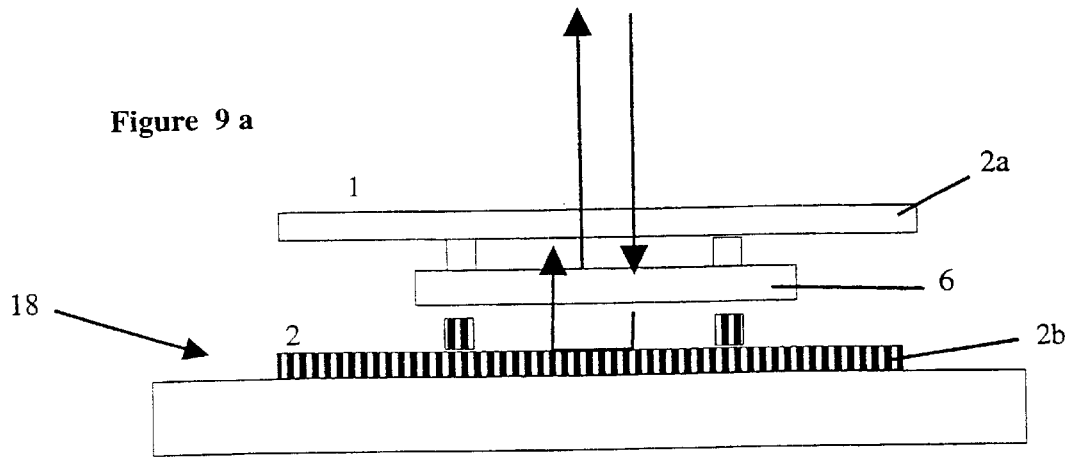
FIG. 9a is an illustration of a micro-mechanical element implementing an optical switch, in a first position.
FIG. 9b is an illustration of the micro-mechanical element of FIG. 9a in a second position.
Figure 9:
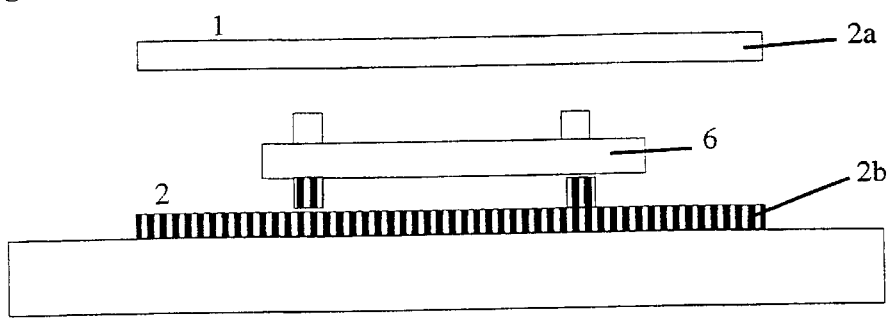

Referring to FIGS. 9a and 9b, a micro-mechanical element 18 may be used to implement an optical switch. The switching element 6 is made from a semi-transparent conducting material such as indium tinoxide or silicon dioxide having a very thin metal layer on one side. When the switching element 6 is in contact with the switching electrode 2a, the optical path link for a light wave entering the top of the optical switch, passing through the switching element 6 and being reflected by the switching electrode 2b is such that it destructively interferes with a light wave reflected from the top surface of the switching element 6. This results in the optical switch reflecting very little light. When the element 6 is in contact with the switching electrode 2b the difference in path length between the two light beams is such that they constructively interfere and the element reflects a larger amount of light. Such an optical switch could be used for a pixel of a display which could switch very quickly.

With a transparent substrate and switching electrode 2b, the optical switch could also work in transmission mode. In such an embodiment, the amount of transmitted light depends on the position of element 6.

Figure 10A:
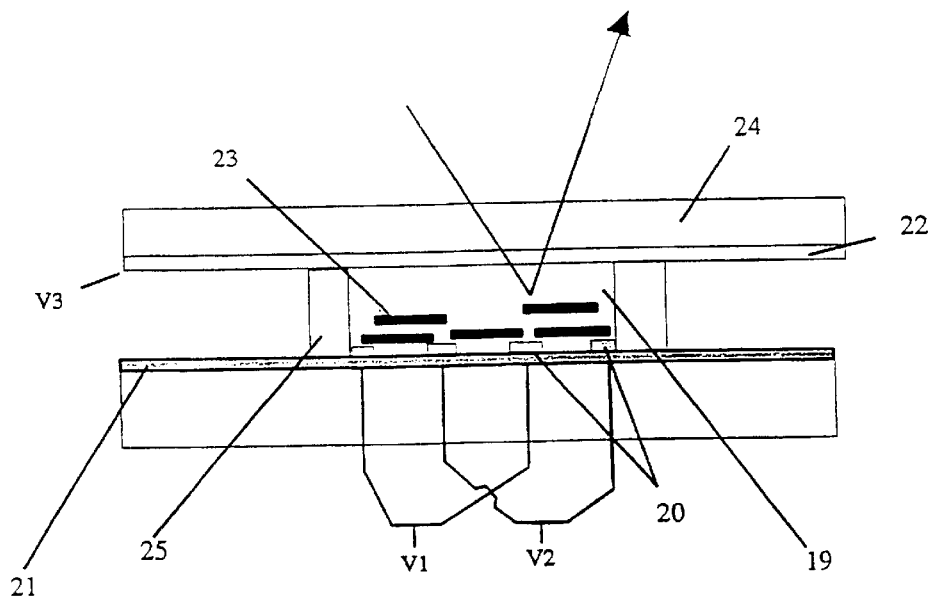
FIG. 10a is an illustration of another micro-mechanical element implementing an optical switch, in a first position.
Figure 10B:
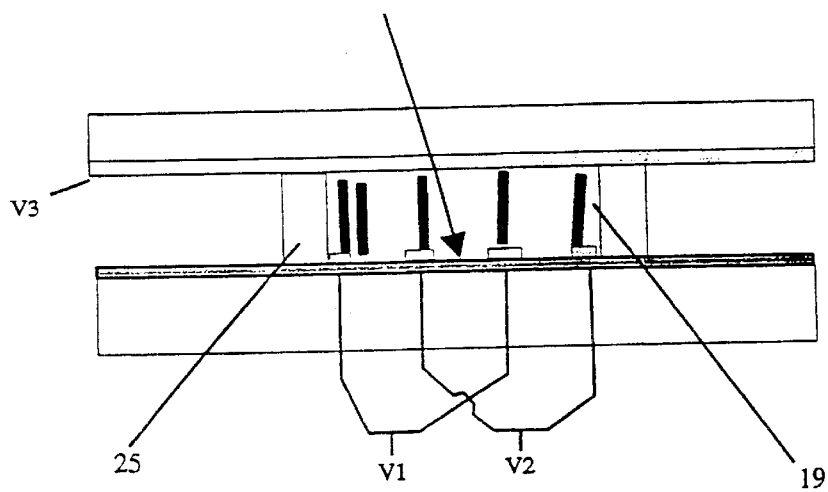
FIG. 10b is an illustration of the micro-mechanical element of FIG. 10a in a second position.

FIG. 10a and FIG. 10b show an alternative optical switch in which the free floating elements are suspended in a fluid 19. Strips 20 of transparent conducting material are placed above a light absorbing layer 21 between two spacers 25. A top transparent conducting layer 24 allows light through to the cell. With a positive voltage on one strip 20 and a negative voltage on the neighbouring strips 20 a lateral electric field polarises the metallic reflective elements 23 lining them up parallel to the substrate as shown in FIG. 10a. The top electrode 22 is grounded. It may be advantageous to use an alternating voltage on the strips 20 to align the elements 23 without pulling them to one particular electrode. The alternating voltages are preferably 180° out of phase with each other on neighbouring strips 20. The reflective elements 23 now cover the non-reflective substrate 21 and light is reflected from them. By making the top electrode 22 negative and the bottom strips 20 positive the metal elements 23 line up perpendicular to the non-reflective substrate 21 as shown in FIG. 10b. An alternating voltage could also be used to prevent the elements being pulled to the top or bottom. The non-reflective substrate 21 is now revealed and light is not reflected.

If each optical switch forms a pixel, different coloured pixels could be produced using different coloured surface coatings on top of the pixels. It will be appreciated that an optical switch could also be made with the substrate 21 reflecting and the elements 23 coated with light absorbing material. The device could also be made to work in transmission mode with a transparent substrate 21 without an absorbing layer underneath. Also, the elements 23 could be magnetic and the switching via electromagnetic forces from currents in wires.

It can be appreciated that the switching described in all of the above examples need not be electrostatic but could be implemented using electromagnetic switching. For example, the switching element 6 is made from a magnetised material and force is applied to the switching element by currents in wires in the positions of the electrodes 2a, 2b. Similarly, the position of the electrode may be detected using magnetic field detectors rather than a capacitance sensing circuit.

Figure 11A:
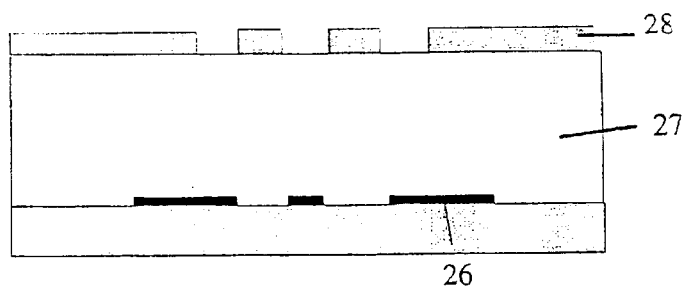
FIG. 11a is an illustration of another example of a micro-mechanical element at a first stage of manufacture.
Figure 11B:
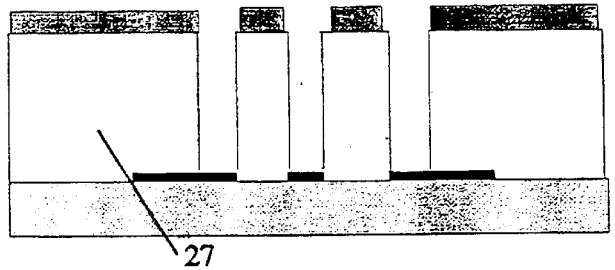
FIG. 11b is an illustration of the micro-mechanical element of FIG. 11a at a second stage of manufacture.
Figure 11C:
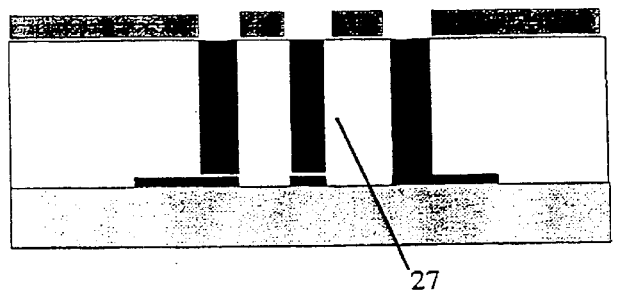
FIG. 11c is an illustration of the micro-mechanical element of FIG. 11a at a third stage of manufacture.
Figure 11D:
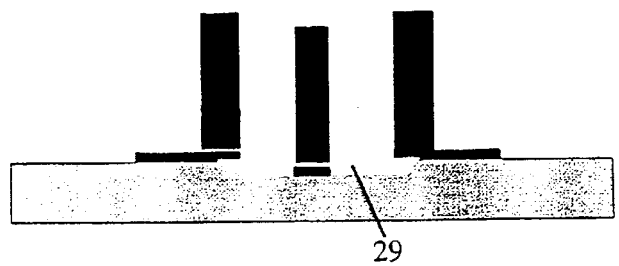
FIG. 11d is an illustration of the micro-mechanical element of FIG. 11a at a fourth stage of manufacture.
Figure 11E:
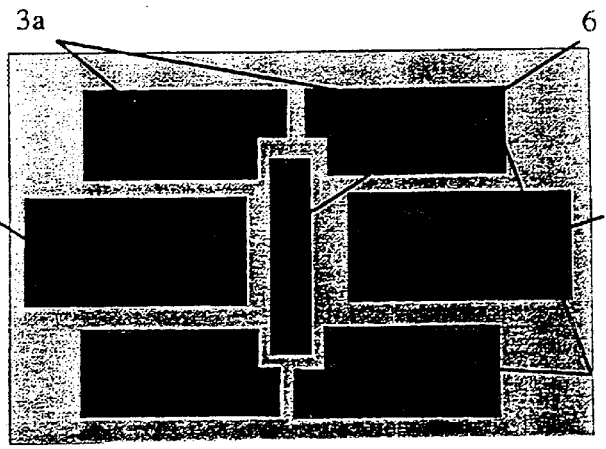

Referring to FIGS. 11a to 11e there is an alternative method for fabricating the micro-mechanical elements of the invention. To save space and to reduce the number of lithographic stages an element can be fabricated with a vertical design. That is, the switching element 6 and switching electrodes 2a, 2b sit with their long side perpendicular to the substrate 1. Firstly a patterned thin metal layer 26 is applied to a substrate 1 using conventional semiconductor processing techniques. Then a thick layer 27 of material is deposited on a surface of the substrate 1. This layer 26 can be several microns thick and could be a polymer. A top layer 28 is then applied, patterned for example as shown in FIG. 11a. Anisotropic etching, which may be reactive ion etching, is used to etch vertically down through the thick layer 25, as shown in FIG. 11b. Metal is then electroplated up through the etched layer, as shown in FIG. 11c. Finally the top layer 28 and thick layer 27 are removed leaving vertical metal structures and the lower thin metal layer pattern 26. There is now an undercut etch 29 into the substrate material 1 which allows the central element to be freed from the substrate. The side electrodes have a larger area and so are not etched off. FIG. 11e shows the top view of the structure with two switching electrodes 2a, 2b which allow a switching element 6 to be switched from contacting the two right hand contact electrodes 36 to contacting two left hand contact electrodes 3a. The devices from FIGS. 2 to 6 can be manufactured using this technique.

What is claimed is:

1. A micro-mechanical element comprising:
   a discrete switching element; and
   a switching means for applying force to the switching element to move the switching element between two stable positions.

2. The micro-mechanical element of claim 1, wherein the switching means comprises one or more electrodes for applying electrostatic force to the switching element.

3. The micro-mechanical element of claim 1, wherein in the switching means comprises one or more coils for applying electromagnetic force to the switching element.

4. The micro-mechanical element of claim 1, wherein the micro-mechanical element has one or more protrusions and the switching element has one or more indentations for abutting the protrusions.

5. The micro-mechanical element of claim 4, wherein the number of protrusions is three.

6. The micro-mechanical element of claim 1 wherein a coating is applied to any surface of the micro-mechanical element or switching element to control adhesion between these elements.

7. The micro-mechanical element of claim 1, wherein a coating is applied to any surface of the micro-mechanical element to provide one or more stable positions close to one or more electrodes.

8. The micro-mechanical element of claim 6, wherein the coating is a polymer or oil.

9. An optical switch comprising the micro-mechanical element of claim 1, wherein the switching element is made of a semi-transparent material and one stable position facilitates constructive interference between reflected and transmitted components of light and the second stable position facilitates destructive interference between reflected and transmitted components of light.

10. The micro-mechanical element of any of claim 1, wherein the switching element is suspended in a fluid, and the switching means is arranged to rotate the switching element between stable positions.

11. The micro-mechanical element of claim 10, having a plurality of switching elements.

12. The micro-mechanical element of claim 1, further comprising a pivot, and wherein the switching means operates to tilt the switching element between two stable positions.

13. A logic gate comprising the micro-mechanical element of claim 9, wherein the switching means (6) is arranged to tilt the switching element toward one of the stable positions in response to particular combinations of applied voltages.

14. The micro-mechanical element of claim 1, further comprising a base made of a semi-conductor material with doped regions arranged such that the switching element causes the resistance of the semi-conductor material between two contacts to be different when it is in each of the stable positions.

15. The micro-mechanical element of claim 1, wherein the position of the switching element is detected by a capacitance circuit.

16. The micro-mechanical element of claim 1, wherein the switching element is magnetic, and the switching means comprises a conductor for carrying current to generate a magnetic field of the switching element.

17. The micro-mechanical element of claim 1, wherein the switching element is magnetic, and the position of the switching element is detected by detecting the magnetic field of the switching element.

* * * * *